United States Patent
Bae et al.

[11] Patent Number: 5,635,335
[45] Date of Patent: Jun. 3, 1997

[54] METHOD FOR FABRICATING SEMICONDUCTOR DEVICE UTILIZING DUAL PHOTORESIST FILMS IMAGED WITH SAME EXPOSURE MASK

[75] Inventors: Sang M. Bae; Seung C. Moon, both of Kyoungki-do, Rep. of Korea

[73] Assignee: Hyundai Electronics Industries Co., Ltd., Rep. of Korea

[21] Appl. No.: 353,921

[22] Filed: Dec. 12, 1994

[30] Foreign Application Priority Data

Dec. 10, 1993 [KR] Rep. of Korea ............... 93-27228

[51] Int. Cl.⁶ ..................... G03F 7/36; G03C 1/825
[52] U.S. Cl. ............. 430/312; 430/413; 430/316; 430/317; 430/318; 430/510; 430/512
[58] Field of Search ............... 430/312, 314, 430/316, 317, 318, 510, 512

[56] References Cited

U.S. PATENT DOCUMENTS 4,820,611 4/1989 Arnold, III et al. ............ 430/316
5,374,503 12/1994 Sachdev et al. ............... 430/316

Primary Examiner—Christopher G. Young
Attorney, Agent, or Firm—Merchant, Gould, Smith, Edell, Welter & Schmidt

[57] ABSTRACT

A method for fabricating a semiconductor device, including the steps of: coating an anti-reflective film over a lower layer to be patterned; coating a first photoresist film over the anti-reflective film and subjecting the first photoresist film to a light exposure process using a mask and a development process, thereby forming a first photoresist film pattern having a dimension slightly larger than a desired pattern dimension; etching an exposed portion of the anti-reflective film, thereby forming an anti-reflective film pattern; removing the first photoresist film pattern and coating a second photoresist film over the entire exposed surface of the resulting structure obtained after the removal of the first photoresist film pattern; subjecting the second photoresist film to a light exposure process using the mask and a development, thereby forming a second photoresist film pattern having the desired pattern dimension; and etching an exposed portion of the anti-reflective film pattern and then etching the lower layer, thereby forming a lower layer pattern.

6 Claims, 4 Drawing Sheets

METHOD FOR FABRICATING SEMICONDUCTOR DEVICE UTILIZING DUAL PHOTORESIST FILMS IMAGED WITH SAME EXPOSURE MASK

BACKGROUND OF THE INVENTION

1. Field of the Invention

The present invention relates to a method for fabricating a semiconductor device, and more particularly to a method for forming an anti-reflective film pattern beneath a photoresist film so as to improve a photo contrast upon forming a pattern having a critical dimension by use of a lithography process.

2. Description of the Prior Art

In formation of a pattern having a critical dimension using a lithography process, a light hv incident on a photoresist film via a mask is reflected by the surface of a layer disposed beneath the photoresist film. The reflected light is then reflected by the surface of the photoresist film. This reciprocation of the reflected light is repeated several times, so that energy is transferred to the photoresist film.

FIGS. 1A and 1B are sectional views respectively illustrating a conventional method for forming a photoresist film.

In accordance with this method, first, a lower layer 14 and a photoresist film 13 are sequentially formed over a semiconductor substrate 10, as shown in FIG. 1A. Thereafter, the photoresist film 13 is exposed to a light 11 using a mask 12 formed with chromium patterns on its quartz substrate. During the exposure, the light 11 is partially reflected by the surface of photoresist film 13 while partially transmitting the photoresist film 13. The light transmitting the photoresist film 13 is reflected by the surface of lower layer 14. The reflected light which is denoted by the reference numeral 16 is reflected by the surface of the photoresist film 13. As such a reflection of light is repeated. several times, and the photoresist film is exposed to the light even at portions intended not to be exposed. During the exposure, the light reaching the mask 12 is diffracted at the edge of each chromium pattern of mask 12 while transmitting the mask 12. This diffracted light is then incident on a non-exposure portion of the photoresist film 13. This incident light which is denoted by the reference numeral 17 is then reflected by the surface of lower layer 14.

Thereafter, a development is carried out to remove the light-exposed portion of the photoresist film 13 and thereby to form a photoresist film pattern 13A. FIG. 1B shows a condition the photoresist film pattern 13A has notched portions 20 respectively formed at side wall portions of the pattern.

Where the line space between adjacent chromium patterns of the mask 12 shown in FIG. 1 is approximate to the wavelength of the exposure light, a severe diffraction phenomenon occurs when the light passes through the mask 12. This severe diffraction results in a severely degraded profile of the photoresist film pattern.

An intensity distribution of light emerging from the mask can be found from a modulation transfer function. The intensity distribution of light, that is, the modulation M can be expressed by the following equation:

$$M = \frac{Imax - Imin}{Imax + Imin}$$

where, "Imax" and "Imin" represent the maximum intensity of light and the minimum intensity of light, respectively.

Generally, the modulation M is dependent on the line space between adjacent chromium patterns formed on the mask. For example, the modulation M is reduced as the line space is decreased. At a lower modulation M, the intensity of light is inefficiently distributed in the photoresist film. In this case, no photoresist film pattern may be formed. Even if a photoresist film pattern is formed, it has no vertical surface at its edge.

Also, a modulation M exhibiting a low contrast results in a small process margin, and the manufacture of semiconductor devices becomes difficult.

SUMMARY OF THE INVENTION

Therefore, an object of the present invention is to provide a method for fabricating a semiconductor device, capable of preventing a notching phenomenon from occurring at the photoresist film and thereby improving the profile of the photoresist film pattern.

In accordance with the present invention, this object can be accomplished by providing a method for fabricating a semiconductor device, comprising the steps of: coating an anti-reflective film over a lower layer to be patterned; coating a first photoresist film over the anti-reflective film and subjecting the first photoresist film to a light exposure process using a mask and a development process, thereby forming a first photoresist film pattern; etching an exposed portion of the anti-reflective film, thereby forming an anti-reflective film pattern; removing the first photoresist film pattern and coating a second photoresist film over the entire exposed surface of the resulting structure obtained after the removal of the first photoresist film pattern; subjecting the second photoresist film to a light exposure process using the mask and a development, thereby forming a second photoresist film pattern; and etching an exposed portion of the anti-reflective film pattern and then etching the lower layer, thereby forming a lower layer pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2A to 2E are sectional views respectively illustrating a method for forming a photoresist film pattern in accordance with the present invention.

Figure 1A:
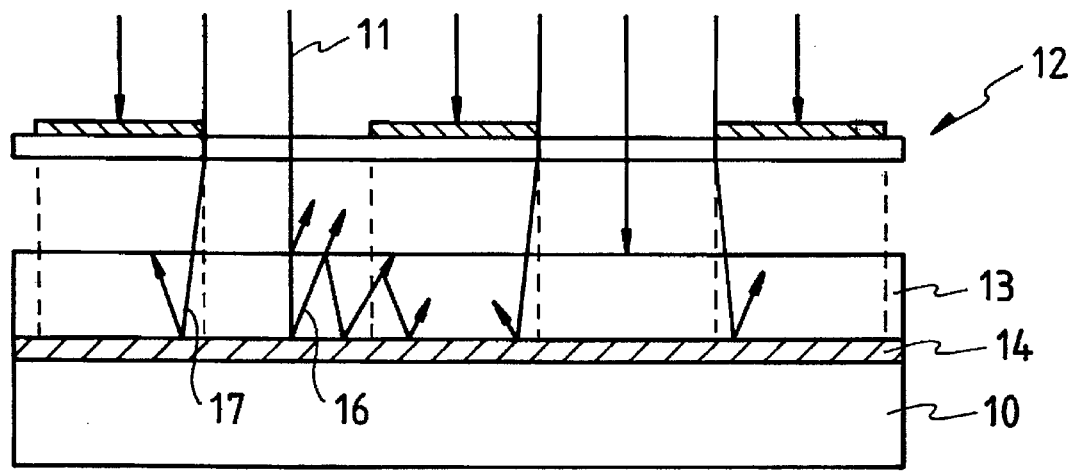
FIGS. 1A and 1B are sectional views respectively illustrating a conventional method for forming a photoresist film.
Figure 1B:
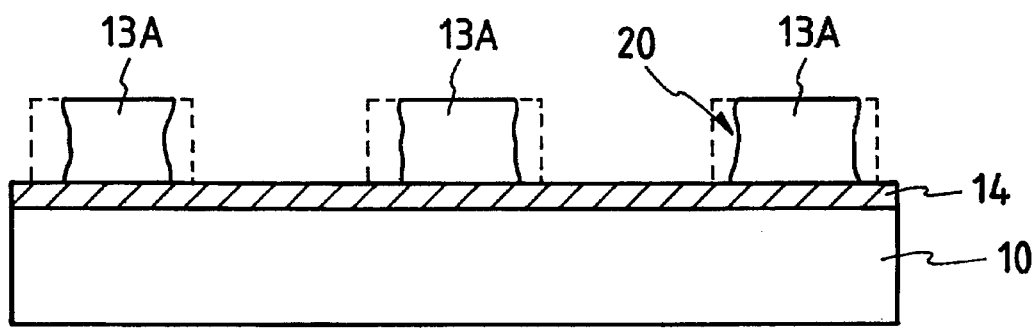
Figure 2A:
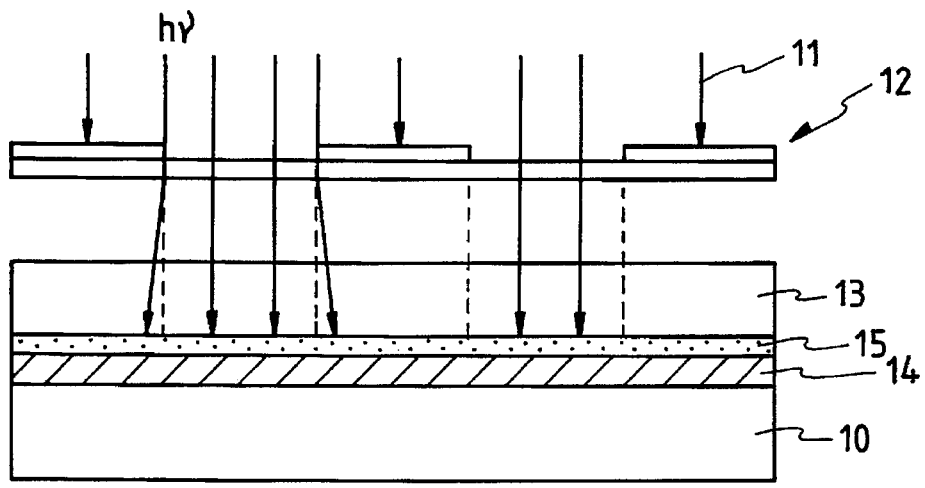
FIGS. 2A to 2E are sectional views respectively illustrating a method for forming a photoresist film pattern in accordance with the present invention.

In accordance with this method, first, over a semiconductor substrate 10 a lower layer 14 and an anti-reflective film 15 are deposited in this order, as shown in FIG. 2A. Over the anti-reflective film 15, a first positive photoresist film 13 is coated. Using a mask 12 having a conventional construction, the first photoresist film 13 is then exposed to a light 11. The first photoresist film 13 has a thickness of about 5,000 Å to enable the anti-reflective film 15 to be subsequently patterned. The anti-reflective film 15 may be a TiN film, an $Si_3N_4$ film or a composite film of $SiO_xN_y$: H. The anti-reflective film 15 has a thickness of about 250 Å to about 2,000 Å. Most of the light passing through the first photoresist film 13 is absorbed in the anti-reflective film 15 disposed beneath the first photoresist film 13 without being reflected by the surface of the anti-reflective film 15.

Figure 2B:
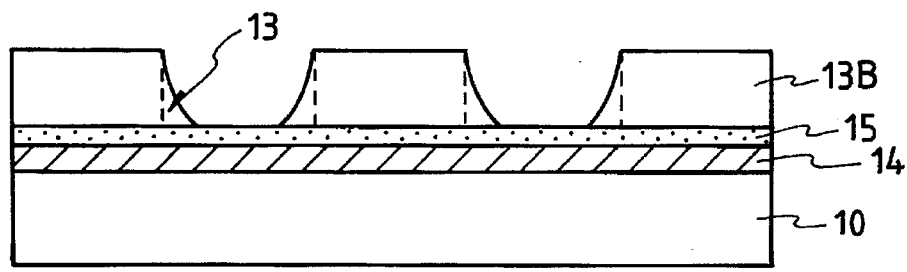

Thereafter, a development is carried out, as shown in FIG. 2B. By the development, a portion of the first photoresist film 13 exposed to the light is removed, thereby forming a first photoresist film pattern 13B. Since most of the light incident on each exposure portion of first photoresist film 13 is absorbed in the anti-reflective film 15, the intensity of light is lowered. As a result, the edge of the exposure portion of first photoresist film 13 is not exposed to the light and thereby is left remaining after the development, as shown in FIG. 2B.

Figure 2C:
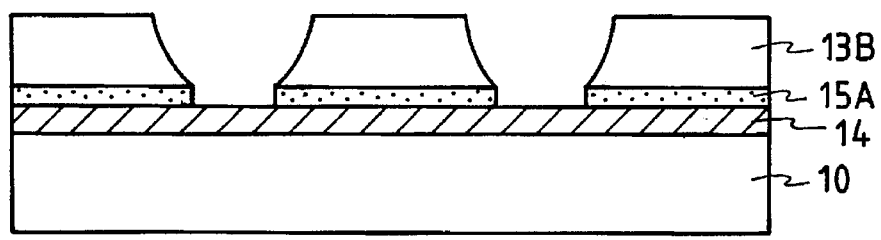

Subsequently, a portion of the anti-reflective film 15 not covered with the first photoresist film pattern 13B is etched, thereby forming an anti-reflective film pattern 15A, as shown in FIG. 2C. Since the first photoresist film pattern 13B includes the edge of the exposure portion of first photoresist film 13, the anti-reflective film pattern 15A also includes a portion of the anti-reflective film 15 disposed beneath the edge of the exposure portion of first photoresist film 13. As a result, the anti-reflective film pattern 15A has a dimension larger than a desired dimension.

Figure 2D:
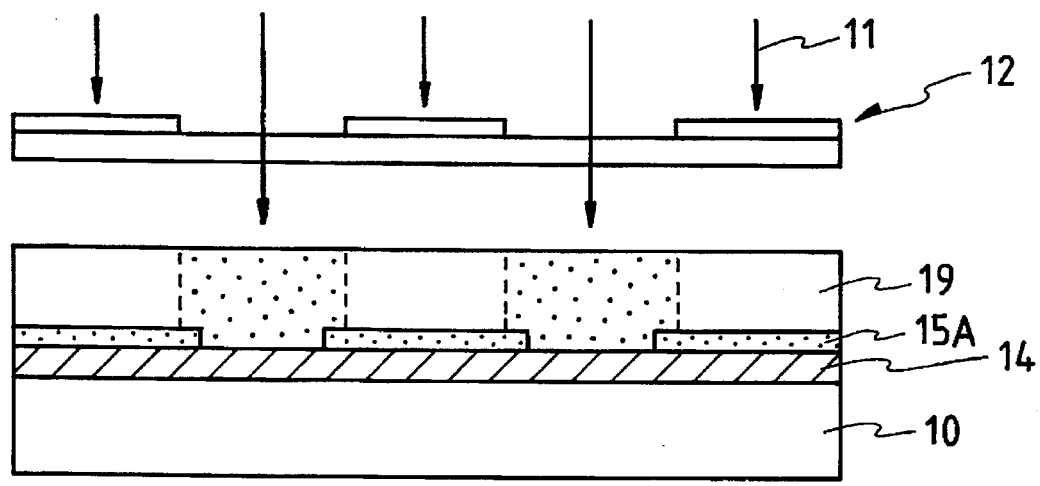

The first photoresist film pattern 13B is then removed. Over the entire exposed surface of the resulting structure, a second positive photoresist film 19 is coated to a thickness of 10,000 Å, as shown in FIG. 2D. Using the mask 12 again, the second photoresist film 19 is subjected to a light exposure.

During the light exposure, the light 11 incident on the second photoresist film 19 is reflected by the surface of the lower layer 14 at the light exposure region, so that its intensity is increased. At the non-exposure region, the light 11 is totally absorbed in the anti-reflective film pattern 15A, so that its intensity is decreased. As a result, the contrast of light is enhanced. In particular, the portion of anti-reflective film pattern 15A left at the light exposure region absorbs the incident light, thereby preventing the light from being reflected toward a portion of the second photoresist film 19 disposed at the non-exposure region.

Figure 2E:
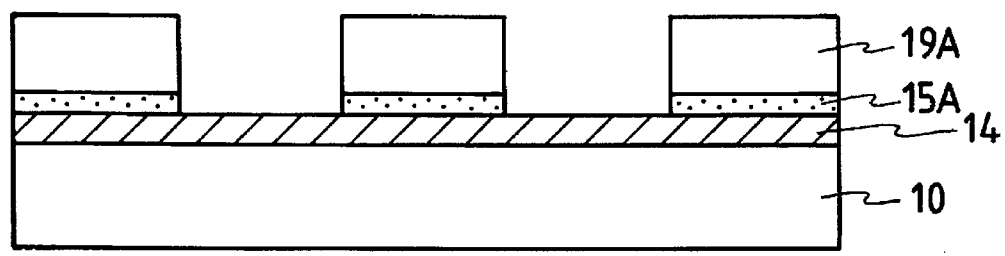

Thereafter, a development is carried out, as shown in FIG. 2E. By the development, a portion of the second photoresist film 19 exposed to the light is removed, thereby forming a second photoresist film pattern 19A. As shown in FIG. 2E, the second photoresist film pattern 19A has a vertical profile at each side wall thereof. That is, the second photoresist film pattern 19A has a desired dimension.

Accordingly, a desired pattern of the lower layer 14 can be obtained as a portion of the lower layer 14 is etched using the second photoresist film pattern 19A as a mask.

Figure 3:
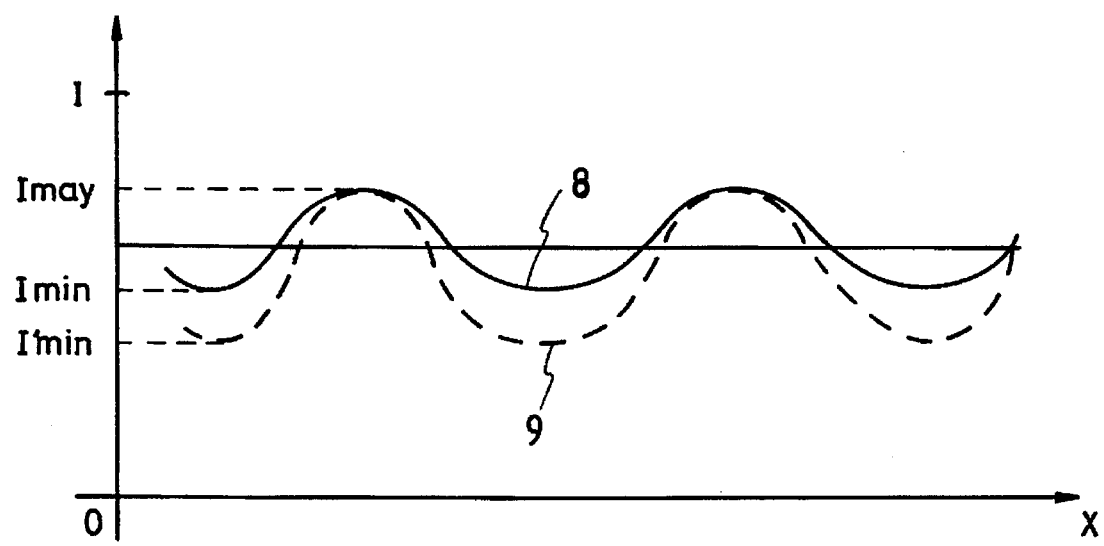
FIG. 3 shows graphs respectively illustrating exposure light energy distributions obtained in accordance with a conventional method and the method of the present invention.

FIG. 3 shows graphs respectively illustrating exposure light energy distributions obtained in accordance with a conventional method and the method of the present invention. In FIG. 3, the X-axis and the Y-axis represent the longitudinal axis of the mask and the exposure light energy, respectively. The graph denoted by the reference numeral 8 is indicative of the intensity of light obtained in accordance with the conventional method, whereas the graph denoted by the reference numeral 9 is indicative of the intensity of light obtained in accordance with the present invention.

Referring to the graphs, it can be found that in the case of the present invention, the intensity of light is maintained in a lower level at the non-exposure region while being maintained in the same level as in the conventional case at the exposure region. This is because the incident light or reflective light is absorbed in the anti-reflective film pattern having a dimension larger than a desired dimension in accordance with the present invention. Accordingly, the case of the present invention exhibits the minimum intensity I'min lower than the minimum intensity Imin of the conventional case while exhibiting the same maximum intensity. As a result, an improvement in light contrast is obtained in accordance with the present invention. Consequently, it is possible to increase the photo process margin and thereby more easily form a pattern having a critical dimension.

In accordance with the present invention, the following effects can be obtained.

First, the exposure energy distribution, namely, the light intensity can be optionally controlled to obtain an improvement in contrast of light. Accordingly, it is possible to form a pattern having a very small critical dimension.

Second, since the light reflected from the lower layer can be selectively absorbed or reflected, the photoresist film pattern has a vertical profile at each side wall thereof.

Third, the exposure energy distributed in the exposure region can be increased to prevent the photoresist film from being undesirably left.

Fourth, a standing wave effect is partially avoided.

Fifth, a notching phenomenon occurring at the photoresist film pattern is prevented.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:
   coating an anti-reflective film over a lower layer to be patterned;
   coating a first photoresist film over said anti-reflective film and subjecting said first photoresist film to a light exposure process using a mask and a development process, thereby forming a first photoresist film pattern;
   etching an exposed portion of said anti-reflective film using said first photoresist film pattern as a mask, thereby forming an anti-reflective film pattern;
   removing said first photoresist film pattern and coating a second photoresist film over the entire exposed surface of said resulting structure obtained after the removal of said first photoresist film pattern;
   subjecting said second photoresist film to a light exposure process using said mask utilized in the forming of said first photoresist film pattern and a development, thereby forming a second photoresist film pattern; and
   etching an exposed portion of said anti-reflective film pattern and then etching an exposed portion of said lower layer using said second photoresist film pattern as a mask, thereby forming a lower layer pattern.

2. A method in accordance with claim 1, wherein the anti-reflective film is comprised of a film exhibiting a high light absorption rate.

3. A method in accordance with claim 1, wherein the first photoresist film has a thickness of about 5,000 Å enabling the anti-reflective film to be patterned.

4. A method in accordance with claim 1, wherein the anti-reflective film has a thickness of 250 Å to 2,000 Å.

5. A method in accordance with claim 1, wherein both the first and second photoresist films are of a positive type.

6. A method in accordance with claim 1, wherein the anti-reflective film is comprised of an $Si_3N_4$ film or a TiN film.

* * * * *